United States Patent
Goux et al.

(10) Patent No.: US 9,691,975 B2
(45) Date of Patent: Jun. 27, 2017

(54) CONDUCTIVE BRIDGING MEMORY DEVICE

(71) Applicants: IMEC VZW, Leuven (BE); KATHOLIEKE UNIVERSITEIT LEUVEN, KU LEUVEN R&D, Leuven (BE)

(72) Inventors: Ludovic Goux, Hannut (BE); Attilio Belmonte, Rende (IT)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 14/955,928

(22) Filed: Dec. 1, 2015

(65) Prior Publication Data
US 2016/0181518 A1    Jun. 23, 2016

(30) Foreign Application Priority Data
Dec. 2, 2014   (EP) ..................................... 14195842

(51) Int. Cl.
*H01L 45/00* (2006.01)
*G11C 13/00* (2006.01)

(52) U.S. Cl.
CPC ........ *H01L 45/085* (2013.01); *G11C 13/0011* (2013.01); *H01L 45/1233* (2013.01); *H01L 45/1266* (2013.01); *H01L 45/141* (2013.01); *H01L 45/146* (2013.01); *H01L 45/1608* (2013.01)

(58) Field of Classification Search
CPC  H01L 45/085; H01L 45/1266; G11C 13/0002
See application file for complete search history.

(56) References Cited

U.S. PATENT DOCUMENTS

| | | | | |
|---|---|---|---|---|
| 2011/0186798 | A1* | 8/2011 | Kwon | H01L 45/06 257/2 |
| 2013/0175494 | A1* | 7/2013 | Collins | H01L 45/085 257/4 |
| 2013/0200320 | A1* | 8/2013 | Goux | H01L 45/04 257/1 |
| 2014/0036570 | A1* | 2/2014 | Lee | G11C 13/0004 365/148 |

\* cited by examiner

*Primary Examiner* — Thomas L Dickey
(74) *Attorney, Agent, or Firm* — McDonnell Boehnen Hulbert & Berghoff LLP

(57) ABSTRACT

A Conductive Bridge Random Access Memory (CBRAM) device comprising an insulating electrolyte element sandwiched between a cation supply electrode and a bottom electrode, whereby the conductivity σ of the cation provided by the cation supply electrode in the electrolyte element increases towards the bottom electrode.

6 Claims, 3 Drawing Sheets

CONDUCTIVE BRIDGING MEMORY DEVICE

CROSS-REFERENCE TO RELATED APPLICATIONS

This application claims priority to European Patent Application No. 14195842.1, filed on Dec. 2, 2014, the contents of which are hereby incorporated by reference.

FIELD OF THE DISCLOSURE

The present disclosure relates to Conductive Bridging Random Access Memory devices, also known as CBRAM devices.

STATE OF THE ART

The Conductive Bridging Random Access Memory (CBRAM) device is considered as a valuable non-volatile storage technology. It offers fast switching, high endurance, low voltage and good scalability.

A CBRAM device contains an insulating layer sandwiched between an active electrode providing metal cations, e.g. $Cu^+$ or $Ag^+$, and an inert electrode. The operation of the CBRAM device relies on the voltage-induced redox-based formation and rupture of a Cu- or Ag-based conical shaped conductive filament (CF) in the insulating layer acting as a solid state electrolyte. When an electrical field is applied between both electrodes, Cu- or Ag cations provided by the active electrode will drift towards the opposite inert electrode through the insulating layer. As a result, the CBRAM device can be reversible switched between a high resistive (HRS) or reset state and a low resistive (LRS) or set state.

The conical shape of the Cu- or Ag-based conductive filament results in a confinement of the electrical field at its tip. This electrical field confinement results in a low reset voltage, typically 0.1-0.2V for CBRAM devices. In relation to this low reset voltage, the voltage-disturb immunity of the LRS state is poor. In addition, the CBRAM typically exhibit a weaker LRS retention state.

Hence, there is a need for a CBRAM device that does not suffer from one or more of the above shortcomings of the state-of-the-art CBRAM devices.

SUMMARY

A Conductive Bridge Random Access Memory (CBRAM) device (1) is disclosed. The CBRAM device comprises an insulating electrolyte element sandwiched between a cation supply metal electrode and a bottom electrode, the conductivity a of the cation provided by the cation supply electrode (3) in the electrolyte element (2) increases towards the bottom electrode (4).

In one embodiment, the electrolyte element comprises a top layer of a first dielectric material stacked on a bottom layer of a second dielectric material, the cation conductivity a in the first dielectric material (6) being lower than in the second dielectric material.

Preferably the second dielectric material is selected from the group consisting of chalcogenides.

Preferably the first dielectric material is selected from the group consisting of Aluminaoxides.

Preferably the cation supply electrode comprises copper or silver.

The cation supply electrode can further comprise a metallic liner in contact with the electrolyte element. In case of a copper-containing cation supply electrode, this metallic liner is preferably a Tantalum or a Titanium-Tungsten liner.

The bottom electrode can comprise or consist of tungsten. Optionally the second dielectric material is an amorphous or crystalline tungsten oxide formed by a controlled thermal oxidation of the bottom electrode.

A method is disclosed for manufacturing a Conductive Bridge Random Access Memory (CBRAM) device, according to the foregoing paragraphs. The method comprises forming a bottom electrode, forming an electrolyte element on the bottom electrode, and forming a cation supply electrode on the electrolyte element. The composition of the electrolyte element is selected to have an increase of the conductivity a of the cation provided by the cation supply electrode in the electrolyte element towards the bottom electrode.

BRIEF DESCRIPTION OF THE FIGURES

For the purpose of teaching, drawings are added. These drawings illustrate some aspects and embodiments of the disclosure. They are only schematic and non-limiting. The size of some of the elements may be exaggerated and not drawn on scale for illustrative purposes. The dimensions and the relative dimensions do not correspond to actual reductions to practice of the disclosure. Like features are given the same reference number.

DETAILED DESCRIPTION

The present disclosure will be described with respect to particular embodiments and with reference to certain drawings but the disclosure is not limited thereto. Furthermore, the terms first, second and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein. Moreover, the terms top, under and the like in the description are used for descriptive purposes and not necessarily for describing relative positions. It is to be understood that the terms so used are interchangeable under appropriate circumstances and that the embodiments of the disclosure described herein are capable of operation in other orientations than described or illustrated herein.

In a first aspect, the present disclosure relates to the controlled formation of an hourglass-shaped conductive filament (CF) during programming of the Conductive Bridging Random Access Memory (CBRAM) device, solving inter alia the poor Low Resistive State (LRS) disturb and retention.

Figure 1:
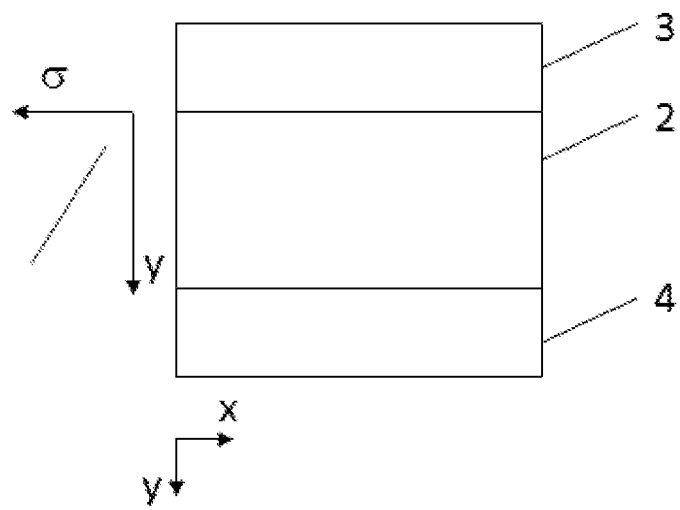
FIG. 1 illustrates a first embodiment.

Such hourglass-shaped conductive filament is obtained by a CBRAM device as illustrated in FIG. 1. Here a Conductive Bridge Random Access Memory (CBRAM) device (1) is shown comprising an insulating electrolyte element (2) sandwiched between a cation supply metal electrode (3) and a bottom electrode (4), whereby the conductivity a (S/m) of the metal cation provided by the metal cation supply electrode (3) in the electrolyte element (2) increases towards (y) the inert bottom electrode (4). The bottom electrode (4) is labelled 'inert' as it doesn't provide cations during the filament (11) forming process.

This increase in cation conductivity can be obtained by stacking multiple layers (i) of dielectric material, whereby for two superjacent layers (5,7) the cation conductivity in the dielectric layer (5) nearest to the cation supply metal electrode (3) is lower than the cation conductivity in the dielectric layer (7) more remote from this cation supply metal electrode (3). Depending on this difference in cation conductivity between superjacent layers, the cation conductivity increase in the electrolyte element (2) is determined and hence the shape of the hourglass-shaped conductive filament (11) can be controlled. Preferably the ratio of the cation conductivity of the two superjacent layers (5,7) is at least 10. The shape of the complete conductive filament (11) is also dependent on the thickness ($t_i$) of each dielectric layer (i). Preferably the cation conductivity ratio ($\sigma_i/\sigma_{i+1}$) of two superjacent dielectric layers (5,7) is proportional to the square of the thickness ratio ($t_i/t_{i+1}$) of these two layers.

Figure 2:
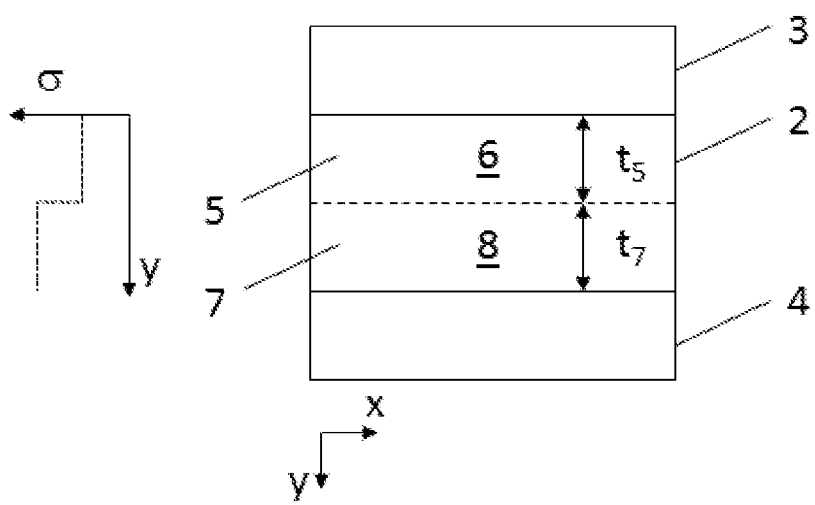
FIG. 2 illustrates a second embodiment.

FIG. 2 shows an embodiment where the electrolyte element (2) is constructed as a stack of two superjacent dielectric layers (5,7). The electrolyte element (2) has a top layer (5) of a first dielectric material (6) having a thickness $t_5$ stacked on a bottom layer (7) of a second dielectric material (8) having a thickness $t_7$, the cation conductivity a in the second dielectric material (8) being higher than in the first dielectric material (6).

Preferably the cation conductivity of the top layer (5) is at least one decade lower than the cation conductivity of the bottom layer (7). More preferably, the ratio between both cation conductivities is at least 1 e4.

Figure 3A:
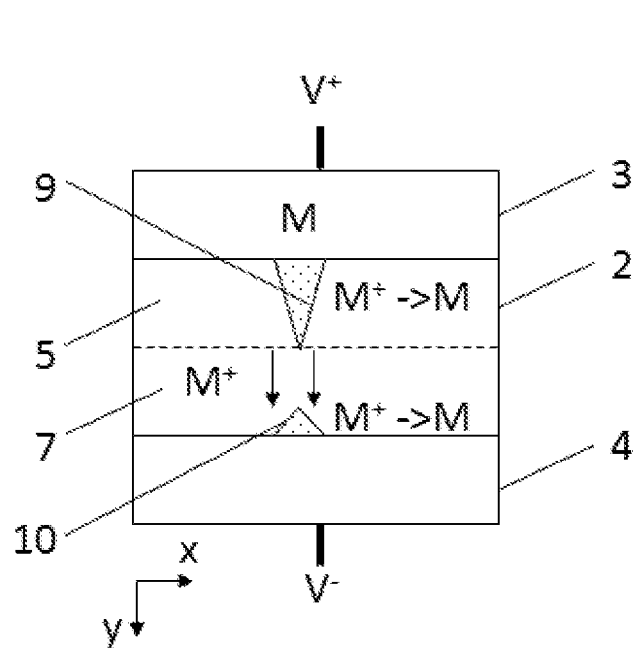
FIG. 3a-3b illustrates the programming of a CBRAM device as disclosed in FIG. 2.
Figure 3B:
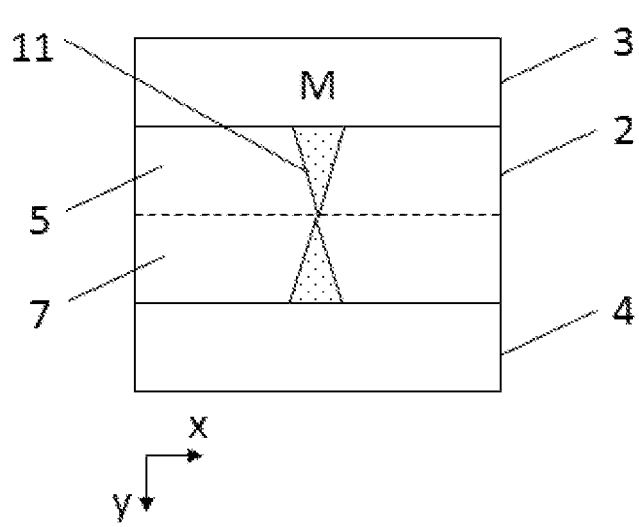

The shape of the conductive filament (11) formed when programming of the CBRAM device (1) during the SET operation, is controlled by engineering this bilayer stack (5,7) of the insulating electrolyte element (2). FIGS. 3a and 3b shows such bilayer stack (2) where 2 insulating layers (5, 7) are sandwiched between the cation supply top electrode (3) and the inert bottom electrode (4) of the CBRAM device (1).

When biasing ($V^+$-$V^-$) the top electrode (3) positive with respect to the bottom electrode (4), an electrical field is applied over the electrolyte element (2). In the bilayer stack (5,7), the conductive filament (11) then partially grows (9) from the cation supply metal electrode (3) towards the bottom dielectric layer (7) due to cation reduction, $M^+ \rightarrow M$, within the top layer (5). Some $M^+$ cations when reaching the bottom dielectric layer (7) will migrate faster to the inert bottom electrode (4) where cation reduction, $M^+ \rightarrow M$, takes place leading to a partial conductive filament (10) growing from the bottom electrode (4) towards the top dielectric layer (5) as illustrated in FIG. 3a. This growth process results into an hourglass-shaped conductive filament (11) having a constriction in the vicinity of the interface between both dielectric layers (5,7) as illustrated in FIG. 3b. In order to preserve sufficient device asymmetry for controlled bipolar switching, one may engineer different thicknesses of the dielectric layers (5,7) whereby the top dielectric layer (5) is thicker than the bottom dielectric layer (7), i.e. $t_5 > t_7$.

Preferably the dielectric material (8) of the bottom layer (7) is selected from the group consisting of chalcogenides or comprises a chalcogenide.

The dielectric material (8) may comprise or be selected from the group consisting of mixed ionic-electronic conductors (MIEC), such as CeO, ZrO, $Y_2O_3$, and Yttria Stabilized Zirconia (YSZ), characterised by their very high ionic conductivity.

Preferably the dielectric material (6) of the top layer (5) may comprise or be selected from the group consisting of alumina oxides, hafnium oxides, tantalum oxides, and silicon oxides of silicon nitrides.

The cation supply electrode (3) can comprise Cu or Ag, supplying respectively $Cu^+$ and $Ag^+$ cations during programming. Preferably the cation supply electrode (3) is a Cu alloy, such as Cu—Te, Cu—Ge, Cu—Ge—Te, Cu—Te—C, Cu—Ti.

Optionally a metallic liner (not shown) is formed, separating the cation supply electrode (3) from the electrolyte element (2). In case a Cu or Ag containing top electrode (3) is formed, this metallic layer contains Ta or TiW.

Typically the bottom electrode (4) comprises tungsten. Preferably the bottom electrode (4) is formed of tungsten.

Figure 4:
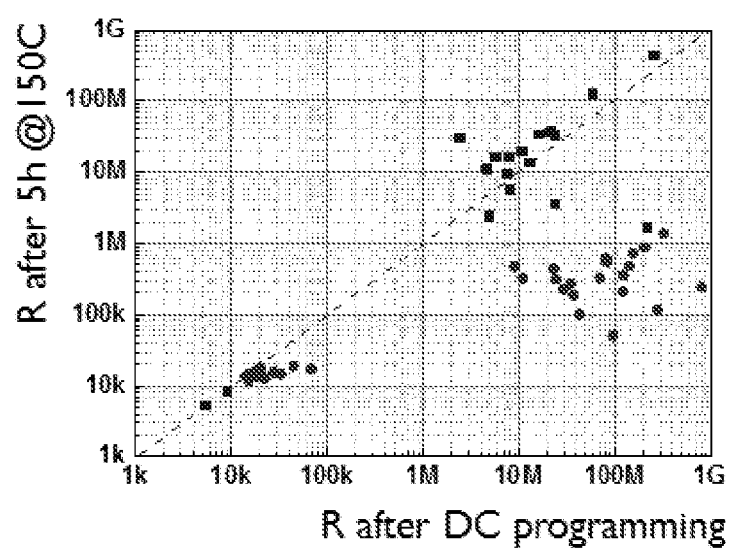
FIG. 4 compares the retention properties of a CBRAM as disclosed with a prior art CBRAM.

If the bottom electrode comprises or is formed of tungsten, then the dielectric material (8) of the bottom layer (7) may be an amorphous or, preferably, a crystalline tungsten oxide. This crystalline tungsten oxide may be $WO_3$. Such a crystalline tungsten oxide has an increased breakdown strength and increased endurance strength. Retention properties are superior for thermally grown (>350° C.) amorphous or crystalline $WO_3$ as compared to a native tungsten oxide which already forms, in an uncontrolled way, when the tungsten is exposed at normal conditions at about 20° C. and at about 1 atm. to clean room ambient tungsten oxide. FIG. 4 compares the retention of a memory cell (1) having a copper top electrode (3) and a tungsten bottom electrode (4), whereby an $Al_2O_3$ top layer (5) is stacked on a tungsten oxide bottom layer (7). The filled circles correspond to the case where this tungsten oxide is a native oxide, where the filled squares correspond to the case where this tungsten oxide is thermally grown resulting a thermally grown amorphous or crystalline oxide. For the native tungsten oxide case the resistance R after the stress test is considerably lower than the initial resistance R.

In a second aspect, a method for forming a CBRAM device according to the first aspect is disclosed. Such method for manufacturing a Conductive Bridge Random Access Memory (CBRAM) device (1) according to the first aspect comprises: forming an inert bottom electrode (4), forming an electrolyte element (2) on the bottom electrode (4), and forming a cation supply electrode (3) on the electrolyte element (2), whereby the conductivity a of the cation provided by the cation supply electrode (3) in the electrolyte element (2) increases towards the bottom electrode (4).

The cation supply electrode (3) can comprise Cu or Ag, supplying respectively $Cu^+$ and $Ag^+$ cations during programming. Preferably the cation supply electrode (3) is a Cu alloy, such as Cu—Te, Cu—Ge, Cu—Ge—Te, Cu—Te—C, Cu—Ti.

Optionally a metallic liner (not shown) is formed, separating the cation supply electrode (3) from the electrolyte element (2). In case a Cu or Ag containing top electrode (3) is formed, this metallic layer contains Ta or TiW.

Typically the bottom electrode (4) comprises tungsten. Preferably the bottom electrode (4) is formed of tungsten.

If the bottom electrode (4) comprises or is formed of tungsten, then the dielectric material (8) of the bottom layer (7) can be a thermally grown amorphous or, preferably, a thermally grown crystalline tungsten oxide such as $WO_3$. Such thermally grown tungsten oxide can be formed by oxidizing the tungsten electrode in a controlled manner resulting in a denser and crystalline tungsten oxide. Typical oxidation conditions are an oxidation temperature of above 350° C. up to 700° C. with an oxidation time of 1 minute up to 20 minutes. Preferably the oxidation temperature is from about 500° C. to about 600° C. with an oxidation time of 1 minute up to 10 minutes.

The electrolyte element (2) can be configured as bilayer stack by depositing a bottom dielectric layer (7) on the inert bottom electrode (4) and a top dielectric layer (5) on the bottom dielectric layer (7).

Preferably the dielectric material (8) of the bottom layer (7) is selected from the group consisting of chalcogenides or comprises a chalcogenide.

The dielectric material (8) may comprise or be selected from the group consisting of mixed ionic-electronic conductors (MIEC), such as CeO, ZrO, $Y_2O_3$, and Yttria Stabilized Zirconia (YSZ), characterised by their very high ionic conductivity.

Preferably the dielectric material (6) of the top layer (5) may comprise or be selected from the group consisting of alumina oxides, hafnium oxides, tantalum oxides, and silicon oxides of silicon nitrides.

In the above paragraphs, the dielectric layers (5,7) of the electrolyte element (2) are characterised by the conductivity a (S/m) of the cation $M^+$ released by the top electrode (5) in the dielectric material (6,8) of these layers. This conductivity refers to the transport of the cations in these materials when subjected to an electrical field $(V^+-V^-)$ applied over the electrolyte element (2). Instead of conductivity, often reference is made to diffusivity D. For a given material, a direct relation exists between the (frequency ω dependent) ionic (cation) conductivity σ(ω) and the diffusivity $D^\sigma(\omega)$ as expressed by the Nernst-Einstein equation:

$$\sigma(\omega) = \frac{N \cdot q^2}{k_B \cdot T} \cdot D^\sigma(\omega) \quad (1)$$

with $$D^\sigma(\omega) = -\frac{\omega^2}{2 \cdot d} \cdot \int_0^\infty \langle r^2(t) \rangle e^{i\omega t} \, dt \quad (2)$$

whereby N=density of ions, q is their charge (C), T is the temperature (K), ω is frequency (Hz), kB is the Boltzmann constant, $<r^2(t)>$ is the mean square displacement of the ions after the time t(s), d is the dimensionality of the movement (0, 1 or 2).

Typically for Cu, the data on its mobility in different materials is mostly indicated by the diffusion parameters $D_0$ and $E_a$ as derived from the Arrhenius law of diffusion $D=D_0 \exp(-E_a/kT)$. In oxides the maximum diffusion coefficient $D_0$ is typically much smaller than 1 e-5 $cm^2/s$. Typically in silicon oxide or silicon nitride layers, $D_0$ is of the order of 1 e-10 $cm^2/s$. In tungsten oxide, $D_0$ is of the order of 1 e-5 $cm^2/s$. In chalcogenides or mixed ionic-electronic conductors, $D_0$ is typically above 1 e-5 $cm^2/s$. Hence high Cu cation conductivity materials have a diffusion coefficient $D_0$ of higher than 1 e-5 $cm^2/s$, whereas low Cu cation conductivity have a diffusion coefficient $D_0$ less than 1 e-10 $cm^2/sec$.

The invention claimed is:

1. A Conductive Bridge Random Access Memory (CBRAM) device comprising:
   an insulating electrolyte element sandwiched between a cation supply metal electrode and a bottom electrode, wherein the conductivity σ of the cation provided by the cation supply electrode in the electrolyte element increases towards the bottom electrode, wherein the electrolyte element comprises a top layer of a first dielectric material stacked on a bottom layer of a second dielectric material, wherein the cation conductivity σ in the first dielectric material is lower than the cation conductivity σ the second dielectric material, wherein the cation supply electrode comprises Cu or Ag, wherein the bottom electrode comprises tungsten, and wherein the second dielectric material is a thermally grown tungsten oxide.

2. The CBRAM device of claim 1, wherein the second dielectric material comprises a chalcogenide.

3. The CBRAM device of claim 1, wherein:
   the first dielectric material is an Alumina-oxide.

4. The CBRAM device of claim 1, wherein the cation supply electrode further comprises:
   a Tantalum or a Titanium-Tungsten liner in contact with the electrolyte element.

5. The CBRAM device of 1, wherein the bottom electrode comprises tungsten and wherein the second dielectric material is crystalline tungsten oxide.

6. A method for manufacturing the CBRAM device according to claim 1, the method comprising:
   forming the bottom electrode;
   forming the electrolyte element on the bottom electrode; and
   forming the cation supply electrode on the electrolyte element,
wherein the conductivity σ of the cation provided by the cation supply electrode in the electrolyte element increases towards the bottom electrode.

* * * * *